United States Patent
Wang et al.

(10) Patent No.: US 11,360,337 B2
(45) Date of Patent: Jun. 14, 2022

(54) FLEXIBLE SUBSTRATE, METHOD FOR PRODUCING THE SAME AND FLEXIBLE DISPLAY DEVICE

(71) Applicant: BOE TECHNOLOGY GROUP CO., LTD., Beijing (CN)

(72) Inventors: Pinfan Wang, Beijing (CN); Mingche Hsieh, Beijing (CN); Yuanzheng Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 395 days.

(21) Appl. No.: 16/485,669

(22) PCT Filed: Jan. 11, 2019

(86) PCT No.: PCT/CN2019/071441
§ 371 (c)(1),
(2) Date: Aug. 13, 2019

(87) PCT Pub. No.: WO2019/223340
PCT Pub. Date: Nov. 28, 2019

(65) Prior Publication Data
US 2021/0364845 A1    Nov. 25, 2021

(30) Foreign Application Priority Data

May 21, 2018 (CN) .......................... 201810491889.6

(51) Int. Cl.
*G02F 1/1333* (2006.01)
*G09F 9/30* (2006.01)
*H05K 1/02* (2006.01)

(52) U.S. Cl.
CPC ........ *G02F 1/133305* (2013.01); *G09F 9/301* (2013.01); *H05K 1/0278* (2013.01); *H05K 1/0283* (2013.01)

(58) Field of Classification Search
CPC .......... H01L 51/0097; G02F 1/133305; H05K 1/0277–0283; G09F 9/301
See application file for complete search history.

(56) References Cited

U.S. PATENT DOCUMENTS 6,344,161 B1   2/2002   Suresh et al.
6,864,435 B2   3/2005   Hermanns et al.
(Continued)

FOREIGN PATENT DOCUMENTS

CN   1659702 A   8/2005
CN   101185175 A   5/2008
(Continued)

OTHER PUBLICATIONS

First Chinese Office Action dated Nov. 19, 2019, received for corresponding Chinese Application No. 201810491889.6, 25 pages.
(Continued)

*Primary Examiner* — Mariceli Santiago
(74) *Attorney, Agent, or Firm* — Kinney & Lange, P.A.

(57) ABSTRACT

A flexible substrate is provided. The flexible substrate includes: a flexible layer, wherein the flexible layer has a plurality of notches which have a first maximum width along a stretching direction in a stretched state of the flexible layer and have a second maximum width along the stretch direction in an unstretched state of the flexible layer, and wherein the first maximum width is greater than the second maximum width. A flexible display apparatus including the above flexible substrate and a method for producing the flexible substrate are also provided.

16 Claims, 6 Drawing Sheets

(56) References Cited

U.S. PATENT DOCUMENTS

| | | | |
|---|---|---|---|
| 8,763,243 B2 | 7/2014 | Yan et al. | |
| 2010/0002402 A1* | 1/2010 | Rogers | H05K 1/028 |
| | | | 361/749 |
| 2010/0148654 A1 | 6/2010 | Yan et al. | |
| 2010/0330338 A1* | 12/2010 | Boyce | B29C 59/02 |
| | | | 428/156 |
| 2016/0104756 A1 | 4/2016 | Lee et al. | |
| 2016/0190389 A1 | 6/2016 | Lee et al. | |
| 2019/0074345 A1 | 3/2019 | Lee et al. | |
| 2019/0181214 A1 | 6/2019 | Lee et al. | |

FOREIGN PATENT DOCUMENTS

| | | |
|---|---|---|
| CN | 105514139 A | 4/2016 |
| CN | 105742321 A | 7/2016 |
| CN | 106469523 A | 3/2017 |
| CN | 106816100 A | 6/2017 |
| CN | 106966578 A | 7/2017 |
| CN | 107610597 A | 1/2018 |
| CN | 108682305 A | 10/2018 |
| CN | 109192858 A | 1/2019 |
| JP | 2009036859 A | 2/2009 |
| KR | 20150033780 A | 4/2015 |
| TW | 200844925 A | 11/2008 |
| TW | 201023122 A | 6/2010 |

OTHER PUBLICATIONS

Second Chinese Office Action dated Apr. 16, 2020, received for corresponding Chinese Application No. 201810491889.6, 30 pages.

* cited by examiner

US 11,360,337 B2

FLEXIBLE SUBSTRATE, METHOD FOR PRODUCING THE SAME AND FLEXIBLE DISPLAY DEVICE

CROSS-REFERENCE TO RELATED APPLICATION

The present application is a Section 371 National Stage Application of International Application No. PCT/CN2019/071441, filed on Jan. 11, 2019, entitled "FLEXIBLE SUBSTRATE, METHOD FOR PRODUCING THE SAME AND FLEXIBLE DISPLAY DEVICE", which claims the benefit of Chinese Patent Application No. 201810491889.6 filed on May 21, 2018 with the China National Intellectual Property Administration, the whole disclosure of which is incorporated herein by reference.

TECHNICAL FIELD

The present disclosure relates to the field of liquid crystal display technology, and more particularly to a flexible substrate, a method for producing the flexible substrate and a flexible display apparatus.

BACKGROUND

In recent years, flexible display technology develops rapidly. One of factors for achieving the flexible display is to use a flexible substrate and to produce display elements onto the flexible substrate. For example, when the elements are produced on the flexible substrate provided with hole and groove regions, no elements can be arranged in the positions of the hole and groove regions. And pitches between holes and grooves are typically greater than aperture of pixels such that high resolution cannot be achieved.

SUMMARY

Embodiments of the present disclosure provide a flexible substrate including: a flexible layer, wherein the flexible layer has a plurality of notches which have a first maximum width along a stretch direction in a stretched state of the flexible layer and have a second maximum width along the stretch direction in an unstretched state of the flexible layer, and wherein the first maximum width is greater than the second maximum width.

In some embodiments, the flexible substrate further includes fillers in the notches, wherein there is a weak adhesion interface between the flexible layer and the fillers.

In some embodiments, the flexible layer and the fillers are made from different materials, respectively.

In some embodiments, the plurality of notches further include a plurality of groups of notches and each group of the plurality of groups of notches includes a plurality of notches separated from each other and arranged linearly in the flexible layer.

In some embodiments, in the stretched state of the flexible layer, each group of notches are communicated together to form a hole.

In some embodiments, the hole has a rhombic shape in a cross section thereof parallel to the flexible layer.

In some embodiments, the plurality of groups of notches include rows of notches and columns of notches that are arranged alternately in the flexible layer and separated from each other.

In some embodiments, depths of the notches in the flexible layer are less than or equal to thickness of the flexible layer.

In some embodiments, the flexible substrate further includes: a stretchable base material on which flexible layer is provided.

In some embodiments, orthogonal projections of the notches in the flexible layer on the stretchable base material are located on solid part of the stretchable base material.

In some embodiments, the flexible layer includes: a plurality of functional element regions in which functional elements are arranged; and non-functional element regions between adjacent functional element regions, the notches being arranged in the non-functional element regions.

Embodiments of the present disclosure also provide a flexible display apparatus, including: the flexible substrate as describe in any one of the above embodiments.

Embodiments of the present disclosure also provide a method for producing a flexible substrate, the method including: forming a flexible layer on a base plate; forming notches in the flexible layer; and transferring the flexible layer formed with the notches from the base plate to a stretchable base material to form the flexible substrate.

In some embodiments, before forming the notches in the flexible layer, the method further includes: performing a first drying process on the flexible layer, wherein 10% to 80% of solvent in the flexible layer is removed in the first drying process.

In some embodiments, after forming the notches in the flexible layer, the method further includes: performing a second drying process on the flexible layer, wherein more than 90% of the solvent in the flexible layer is removed in the second drying process.

In some embodiments, before performing the second drying process, the method further includes: forming a filling layer on the flexible layer formed with the notches, wherein a first material forming the flexible layer and a second material forming the filling layer are configured such that there is a weak adhesion interface between the flexible layer and the filling layer; and etching and ashing the filling layer to expose the flexible layer while maintaining part of the filling layer filled in the notches.

In some embodiments, the method further includes: forming a buffer layer on the exposed flexible layer.

In some embodiments, the second drying process further includes curing the flexible layer.

In some embodiments, the method further includes: stretching the stretchable substrate with the flexible layer adhered thereon such that the notches expand and deform until the flexible layer cracks along the notches.

Through the following description of the present disclosure with reference to accompanying drawings, other objects and advantages of the present disclosure will be apparent and it may be helpful to understand the present disclosure comprehensively.

DETAILED DESCRIPTION OF EMBODIMENTS

Figure 1A:
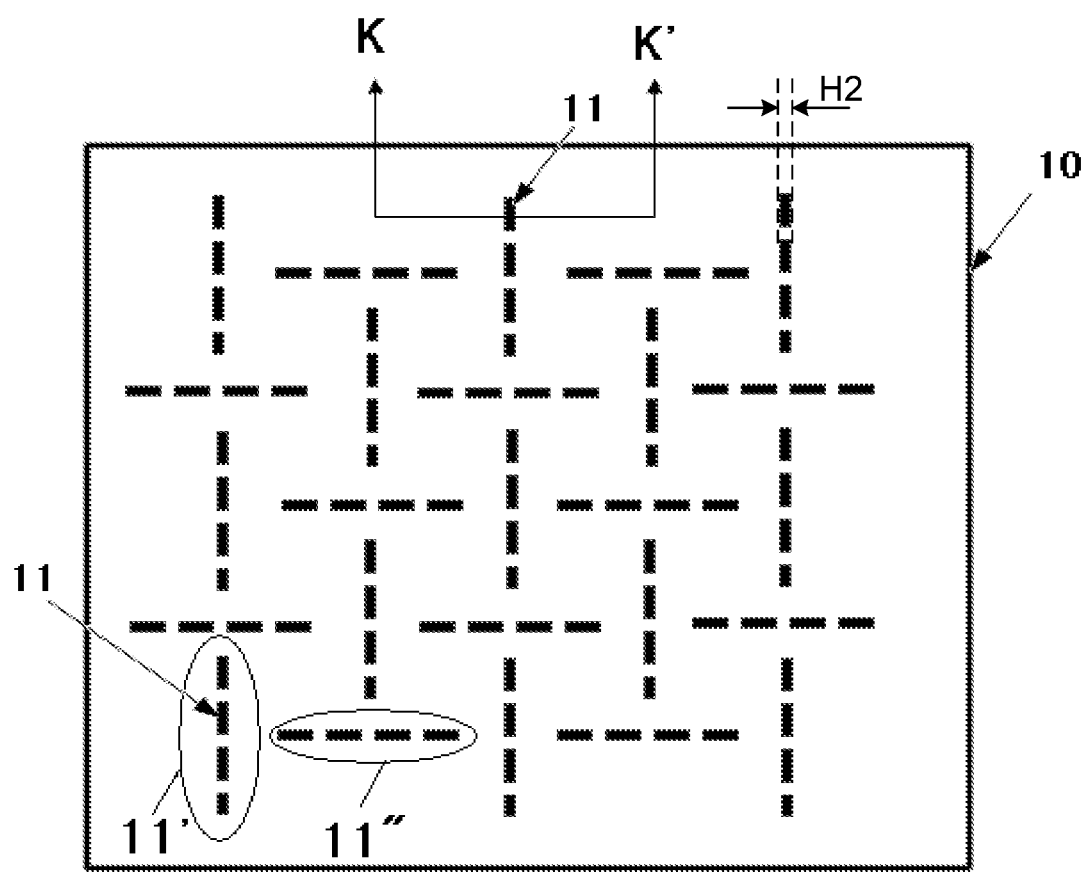
FIG. 1A is a schematic top view showing a structure of a flexible substrate in an unstretched state according to an embodiment of the present disclosure.

Technical solutions of the present disclosure and those in the related art will further be described in detail below with reference to the drawings and embodiments. Throughout the description, same or similar components are represented by same or similar reference numerals. The following description of embodiments of the present disclosure with reference to the accompanying drawings is intended to explain the generic concept of the present disclosure, instead of limiting the present disclosure.

In addition, in the following detailed description, numerous specific details are set forth for interpretation and to provide a full understanding to the disclosed embodiments. However, it is obvious that one or more embodiments can be implemented without these specific details. In other instances, known structures and devices are illustrated in a simplified drawing.

Embodiments of the present disclosure relate to a flexible substrate and a method for producing the flexible substrate and a flexible display apparatus.

In accordance with the concept of the present disclosure, it provides a flexible substrate. The flexible substrate at least includes a flexible layer. The flexible layer has a plurality of notches. When the flexible layer is stretched, the notches have a first maximum width along a stretch direction. When the flexible layer is not stretched, the notches have a second maximum width along the stretch direction. The first maximum width is greater than the second maximum width.

It also provides a method for producing a flexible substrate. The method at least includes: forming a flexible layer on a base plate; forming notches in the flexible layer; and transferring the flexible layer formed with the notches from the base plate to a stretchable base material to form the flexible substrate.

In addition, it also provides a flexible display apparatus including the flexible substrate as described above.

Figure 1B:
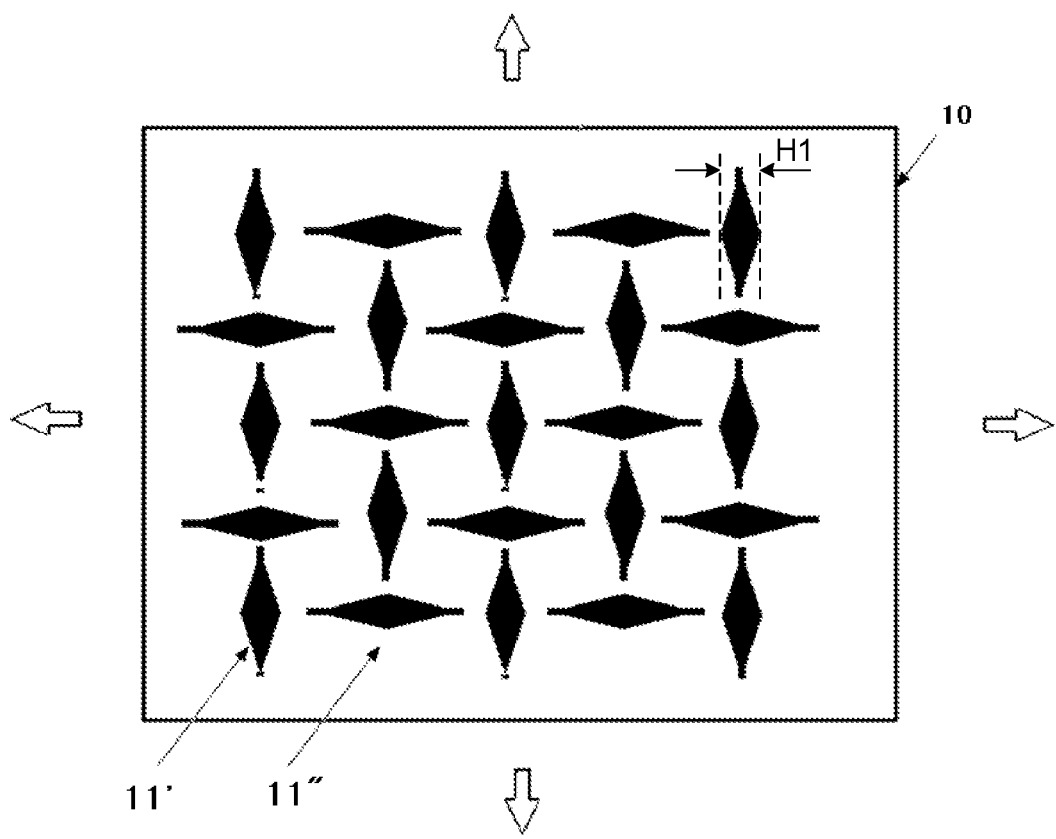
FIG. 1B is a schematic top view showing a structure of the flexible substrate shown in FIG. 1A in a stretched state.

FIG. 1A is a schematic top view showing a structure of a flexible substrate in an unstretched state according to an embodiment of the present disclosure. FIG. 1B is a schematic top view showing a structure of the flexible substrate shown in FIG. 1A in a stretched state. As shown in FIG. 1A, the flexible substrate provided by the embodiments of the present disclosure includes a flexible layer 10. The flexible layer 10 includes a plurality of notches 11 formed therein. In some embodiments, these notches 11 may be formed in groups, for example, a group 11' of notches and a group 11" of notches. When the flexible layer 10 is in the unstretched state (or the flexible substrate is in the unstretched state), the notches 11 are openings with smaller size (for example called as gaps), as shown in FIG. 1A; in contrast, when the flexible layer 10 is in the stretched state (for example along directions indicated by arrows in FIG. 1B), each group of notches 11 are stretched into an opening with larger size (for example it can be called as a hole), as shown in FIG. 1B. The hole has a greater aperture than the gap.

It should be noted that, in the present disclosure, the term of "gap" represents an opening that is formed in the flexible layer and has a smaller aperture. The smaller aperture is at least less than the diameters of the functional elements (for example for display) provided on the flexible substrate. The term of "hole" represents an opening that has a larger aperture and is formed by expanding at least one opening with smaller aperture in the flexible layer when the flexible layer is stretched. The term of "aperture" represents the maximum diameter of a regular or irregular cross section of the "gap" or "hole". In addition, when the flexible layer 10 is in the stretched state, the maximum aperture of the hole is greater than the maximum aperture of the gap along the stretch direction.

Considering that the notches 11 or the groups 11' and 11" of notches may not have regular shapes such as rectangle, circle, in order to accurately express change of the notches 11 or the groups 11' and 11" of notches before they are stretched and after they are stretched, a concept of the maximum width may be introduced. For example, as shown in FIG. 1B, each of the stretched notches 11 has not uniform width along the stretch direction (for example the left-right direction in FIG. 1B) and its maximum width (i.e., a first maximum width) along the stretch direction is indicated by H1. In contrast, the maximum width (i.e., a second maximum width) of the notches 11 that are not stretched shown in FIG. 1A in the stretch direction (for example, corresponding to FIG. 1B, i.e., the left-right direction) is H2. Thus, the first maximum width H1 of the notches 11 along the stretch direction in the stretched state of the flexible layer 10 is significantly greater than the second maximum width H2 of the notches 11 along the stretch direction in the unstretched state of the flexible layer 10. As an example, in order to achieve higher resolution, the second maximum width H2 may be at least less than the profile size (for example diameter) of the functional elements provided on the flexible substrate.

By means of the above structure design, when the flexible substrate provided by the embodiments of the present disclosure is stretched by force (for example, is stretched to have a special magnitude of strain), the notches 11 (or groups 11', 11" . . . of notches) in the flexible layer 10 are expanded into the holes from the gaps until the flexible layer 10 is cracked at the notches 11 (or groups 11', 11" . . . of notches) or regions around the notches 11, to provide deformation required for stretching of the flexible substrate. In this way, it can reduce, or even avoid deformation of the flexible layer 10 at other positions, to prevent the functional elements (for example used for display, such as TFT elements) at other positions of the flexible layer 10 from being affected by stretching strains. It should be noted that the flexible layer 10 may be presented in a form of single layer with a certain thickness, however, the present disclosure is not limited to this. For example, the flexible layer 10 may alternatively have a multi-layer structure. The flexible layer 10 may be made from stretchable and deformable materials such as polyimide (PI).

Figure 6A:
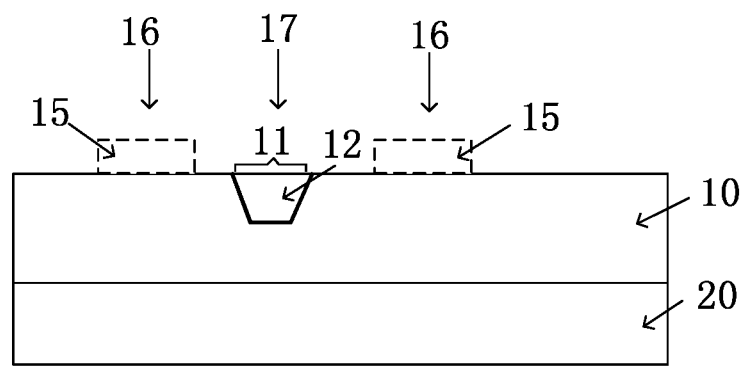
FIG. 6A and FIG. 6B schematically show structures corresponding to FIG. 2A and FIG. 2B respectively and including functional elements.
Figure 6B:
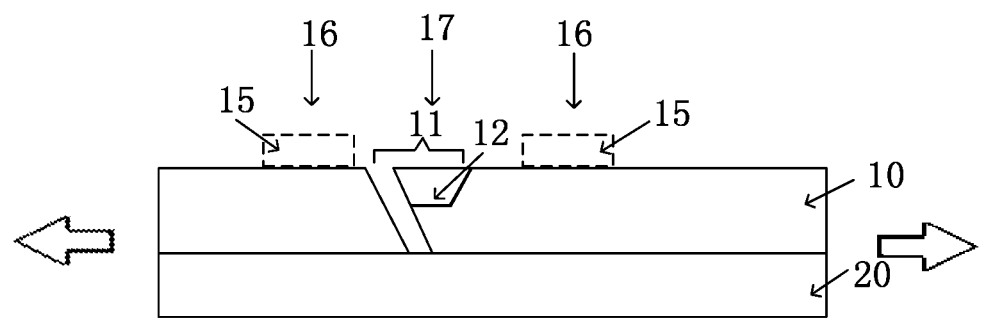

In accordance with embodiments of the present disclosure, the flexible layer may include a plurality of groups of notches. As shown in FIG. 1A, the flexible substrate 10 includes a plurality of groups of notches (or a plurality of notch groups 11', 11" . . . ) and each group (for example 11') of the plurality of groups of notches 11 includes a plurality of notches 11 separated from each other and arranged linearly in the flexible layer 10. For example, the plurality of notches 11 in one group 11' of notches are designed in the flexible layer 10 in form of "dashed lines", that is, the plurality of notches 11 are arranged in one straight line and there is smaller pitch between adjacent notches 11 in the straight line (for example, the pitch is smaller than length of a single notch 11 in the straight line). These groups of notches are formed in the flexible layer 10 at positions where no functional elements (for example, used for display) are formed. For example, these groups of notches are arranged at a side of the positions where the functional elements 15 (for example, shown in dashed lines in FIG. 6A and FIG. 6B) are arranged in the flexible layer 10 or around these positions. In this way, when the flexible substrate is stretched, parts of the flexible layer 10 that are located between adjacent notches in each group of notches will crack along the direction in which the group of notches are arranged such that each group of notches are communicated to form a hole with a larger aperture, to further provide deformation required for the flexible substrate.

As an example, the flexible layer 10 may include a plurality of functional element regions 16 and non-functional element regions 17 between adjacent functional element regions 16. Functional elements (they represent elements for implementing respective circuit functions or parts thereof, such as functional elements for display, TFT, pixel structures, electrodes, even traces) are arranged in the plurality of functional element regions 16. The notches 11 are arranged in the non-functional element regions 17. No functional elements are provided in the non-functional element regions 17. In this way, the deformation of the notches 11 may provide amount of deformation required for the flexible substrate so as to prevent functional elements in the functional element regions 16 from being destroyed due to excessive deformation. This arrangement may utilize space between adjacent functional elements more sufficiently to provide notches.

In addition, a plurality of groups of notches 11 may be arranged depending on strain requirements of deformation of the flexible substrate to control the positions and spaces of cracked faces for stretching of the flexible substrate. For example, the plurality of groups of notches may include rows of notches and columns of notches that are arranged alternately in the flexible layer and separated from each other. As shown in FIG. 1A, one group 11' of notches are arranged in one column in the flexible layer 10 while another group 11" of notches adjacent to the group 11' of notches are arranged in one row in the flexible layer 10. And any adjacent two groups of notches are separated from each other whether in the column direction, or in the row direction. Certainly, in other embodiments of the present disclosure, the plurality of groups of notches may be arranged in any other suitable forms. The embodiments of the present disclosure are not limited to this.

In some embodiments, when the flexible layer 10 is stretched, each group of notches 11 may form a hole with a large aperture by expanding and communicating a plurality of gaps with small apertures. For example, as shown in FIG. 1B, one hole having a rhombic shape with a large aperture (i.e., the hole has a rhombic shape in a cross section parallel to the flexible layer 10) is formed. Certainly, in other embodiments of the present disclosure, expanding structure and expanded shape of the notches may alternatively use other designs of structures and shapes. Embodiments of the present disclosure are not limited to this.

In the flexible substrate provided by embodiments of the present disclosure, the notches 11 are filled with fillers 12. The flexible layer 10 is made from a first material and the fillers 12 are made from a second material. The first material is different from the second material. For example, the adhesion interface between the flexible layer 10 made from the first material and the fillers 12 made from the second material should have weak adhesion property. In this way, the fillers 12 may be separated easily from the notches 11 when the flexible substrate is stretched, for cracking of the flexible layer 10 at the notches 11. It should be noted that the term of "weak adhesion interface" means that any two (same or different) materials are formed into films one after another and the adhesion force formed between the two materials is less than internal cohesive force in the film formed by each material itself. In an example, the first material may be an organic material such as PI and the second material may be an inorganic material. In another example, the first material and the second material are two inorganic materials that can form the weak adhesion interface between them, respectively. In a further example, the first material and the second material are two organic materials that can form the weak adhesion interface between them respectively. It should be noted that when one of the first material and the second material is an organic material and the other of them is an inorganic material, it needs to avoid any chemical or physical bonding reaction between the first material and the second material in essence. When the first material and the second material are both organic materials, it needs to prevent the first material and the second material from being cross-linked neither chemically nor physically during forming the films. The embodiments of the present disclosure are not limited to the case that the first material and the second material are different materials, for example, if the first material and the second material are same but the above "weak adhesion interface" can be achieved by a certain process to cause the flexible layer 10 to tend to crack at the notches 11 when it is stretched, it will be possible that the first material and the second material are same.

Figure 2A:
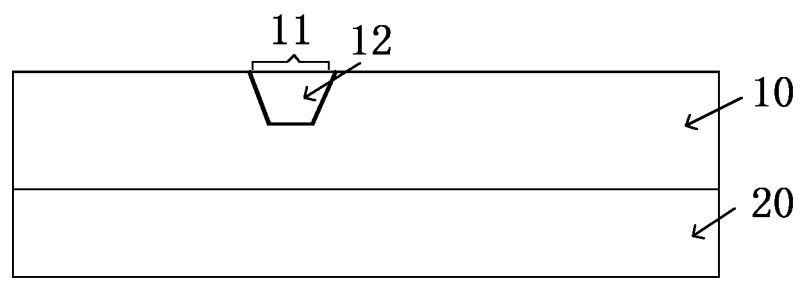
FIG. 2A is a schematic cross sectional view of the flexible substrate shown in FIG. 1A taken along line K-K' in FIG. 1A, in which the flexible substrate is in the unstretched state.
Figure 2B:
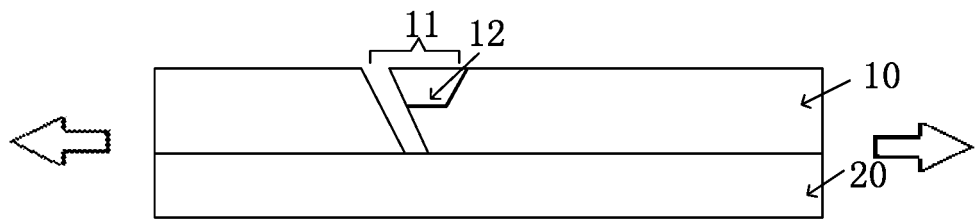
FIG. 2B is a schematic cross-sectional view showing a structure of the flexible substrate shown in FIG. 2A in the stretched state.
Figure 3A:
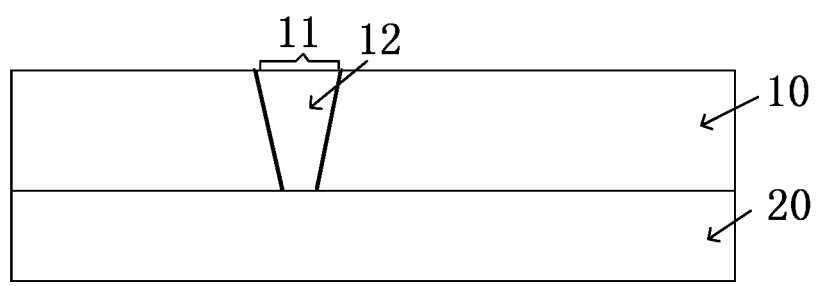
FIG. 3A is a schematic cross-sectional view showing a structure of the flexible substrate in the unstretched state according to another embodiment of the present disclosure.
Figure 3B:
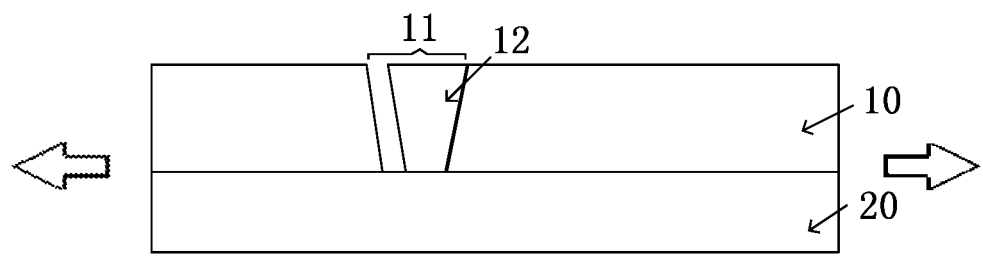
FIG. 3B is a schematic cross-sectional view showing a structure of the flexible substrate shown in FIG. 3A in the stretched state.

In the flexible substrate provided by the embodiments of the present disclosure, depths of the notches in the flexible layer may be less than or equal to the thickness of the flexible layer 10 itself. FIG. 2A is a schematic cross sectional view showing a structure of the flexible substrate shown in FIG. 1A taken along line K-K' in FIG. 1A. FIG. 2B is a schematic cross-sectional view showing a structure of the flexible substrate shown in FIG. 2A in a stretched state. FIG. 3A is a schematic cross-sectional view showing a structure of the flexible substrate in the unstretched state according to another embodiment of the present disclosure. FIG. 3B is a schematic cross-sectional view showing a structure of the flexible substrate shown in FIG. 3A in a stretched state. For the sake of clarity, only one notch 11 formed in the flexible layer 10 is shown schematically. In the embodiment shown in FIG. 2A and FIG. 2B, depths of the notches 11 in the flexible layer 10 are less than the thickness of the flexible layer 10 itself, that is, the notches 11 in the flexible layer 10 are formed as grooves and the grooves are filled with fillers 12 therein. In this case, when the flexible layer 10 is stretched to have a certain magnitude of strain, the flexible layer 10 is torn along side walls of the grooves such that the flexible layer 10 is deformed to crack at the notches 11. In the embodiment shown in FIG. 3A and FIG. 3B, the depths of the notches 11 in the flexible layer 10 are equal to the thickness of the flexible layer 10 itself, that is, the notches 11 in the flexible layer 10 are formed as through openings through the flexible layer 10 and the through openings are filled with fillers 12. In this case, when the flexible layer 10 is stretched to have a certain magnitude of strain, the flexible layer 10 is broken along the side walls of the through openings so as to be deformed to crack at the notches 11. In addition, it should be noted that, the notches 11 have cross sectional shapes of inverted trapezoid in embodiments shown in FIG. 1, however, in other embodiments, the notches 11 may have any other suitable cross sectional shapes. The present disclosure is not limited to this.

In addition, in some embodiments of the present disclosure, the flexible substrate further includes: a stretchable base material 20 and the flexible layer 10 is arranged on the stretchable base material 20, as shown in FIG. 2A to FIG. 3B. As an example, projections of the notches 11 in the flexible layer 10 on the stretchable base material 20 may be located on solid part of the stretchable base material 20. That is, no openings are provided on the positions on the stretchable base material 20 corresponding to the notches 11, which is helpful to enhance strength of the flexible substrate.

In this way, the flexible substrate provided by embodiments of the present disclosure may in particular be used as, for example, a base substrate in a flexible OLED or liquid crystal display screen.

Further, embodiments of the present disclosure also provide a flexible display apparatus including the flexible substrate described in any one of the above embodiments. In particular, the above flexible display apparatus may be any products or components having flexible display functions, such as a flexible liquid crystal display apparatus, a liquid crystal display, a liquid crystal TV, or an organic electroluminescent display apparatus, an organic electroluminescent display, an organic electroluminescent TV, a digital camera frame, a cell phone, a tablet computer, a navigator.

Thus, in the flexible substrate and the flexible display apparatus provided by embodiments of the present disclosure, a plurality of notches are formed in the flexible layer of the flexible substrate. When the flexible substrate is stretched, these notches can be expanded until the flexible layer cracks at these notches to provide deformation required for the flexible substrate, so as to reduce or even prevent functional elements (for example used for display) on the flexible substrate from being affected by stretching strains, so as to improve display quality of the flexible display apparatus including the flexible substrate. And a plurality of groups of notches separated from each other are formed on the flexible layer and each group of notches include a plurality of notches separated from each other and arranged linearly in the flexible layer. When the flexible substrate is stretched, parts between adjacent notches in each group of notches in the flexible layer crack along the direction in which the group of notches are arranged such that each group of notches form a hole with larger aperture, to further provide the deformation required for the flexible substrate. In addition, by designing the specific positions of the notches on the flexible layer in advance, the position and space of the cracking faces of the flexible layer when the flexible substrate is stretched can be controlled. Further, by designing expandable notches in a form of gaps with small aperture on the flexible layer, the resolution of wiring can be enhanced in comparison with, for example, hole and groove regions in the related art.

Figure 4:
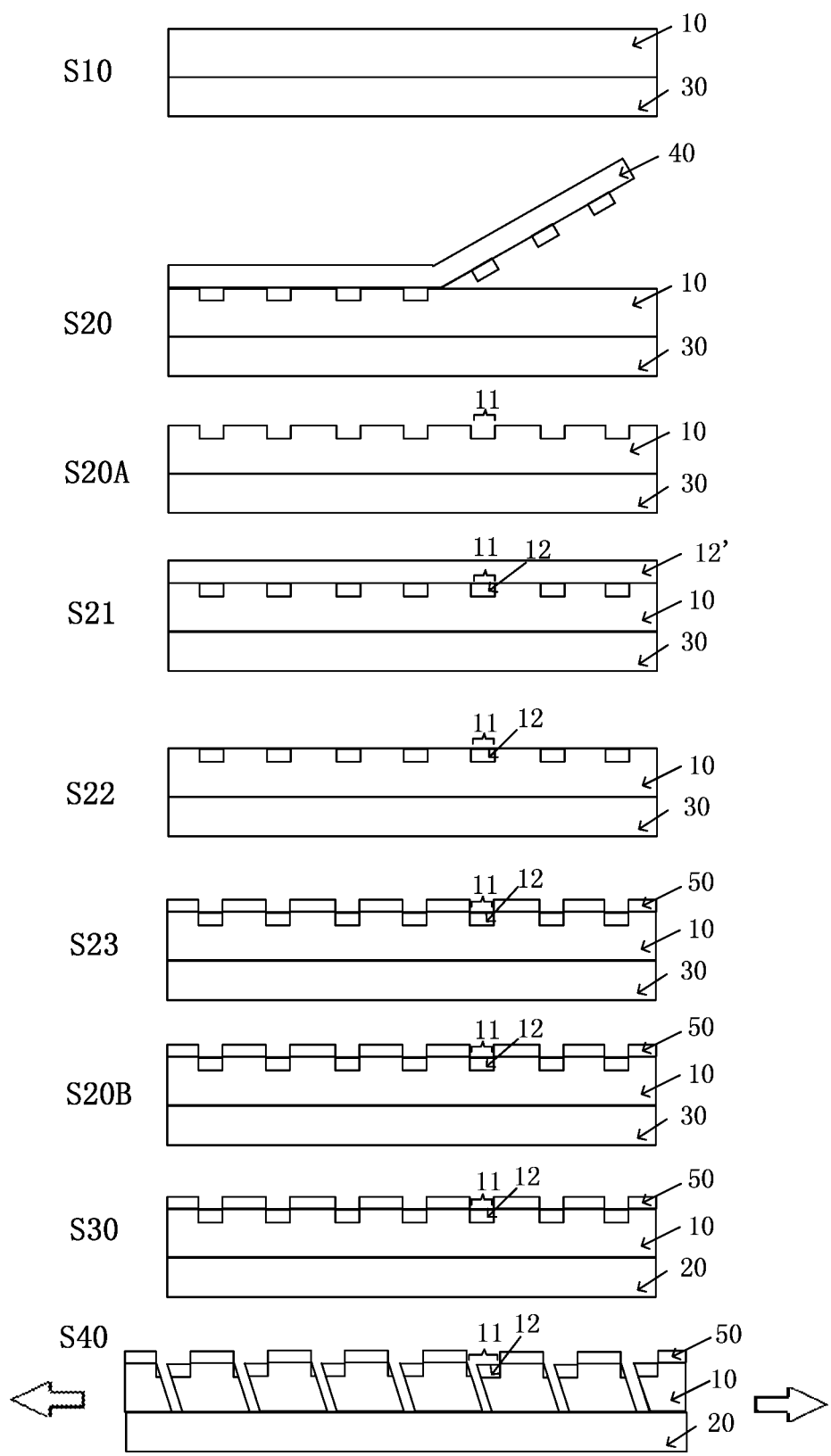
FIG. 4 is a diagram showing a method for producing a flexible substrate according to an embodiment of the present disclosure.
Figure 5:
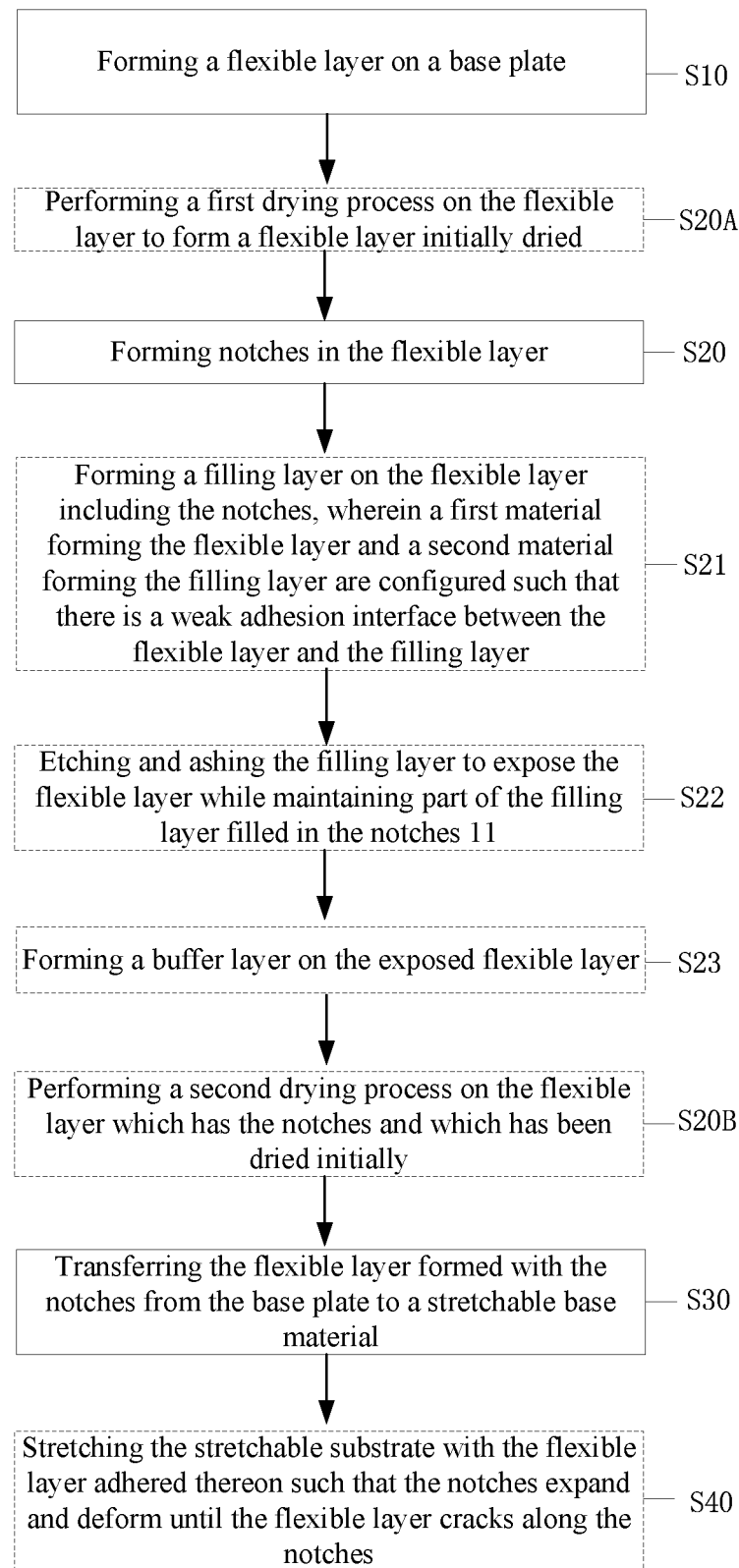
FIG. 5 is a flow chart showing a method for producing a flexible substrate according to an embodiment of the present disclosure.

Meanwhile, embodiments of the present disclosure also provide a method for producing a flexible substrate. FIG. 4 is a diagram showing a method for producing a flexible substrate according to an embodiment of the present disclosure. FIG. 5 is a flow chart showing a method for producing a flexible substrate according to an embodiment of the present disclosure. The method for producing the flexible substrate described in the above embodiments of the present disclosure will below be described with reference to FIG. 4 and FIG. 5. It should be noted that optional steps are represented by dashed block in FIG. 5. The skilled person in the art may select or may not select these steps as required.

The method for producing the flexible substrate in which the present disclosure is involved will below be described with reference to FIG. 4 and FIG. 5.

The step S10: forming a flexible layer 10 on a base plate 30.

In the above step S10, the base plate 30 may be for example a glass base plate. The raw material of the flexible layer may be a solution of material that is suitable for producing the flexible layer and has stretchable property and flexible property, for example, solution of PI material. In some embodiments of the present disclosure, the flexible layer (or called as a first film layer) may be formed on the back plate by coating. However, in other embodiments, any suitable processes for forming the flexible layer may alternatively used, such as dipping or adhering.

The step S20: forming notches (or called as recesses) 11 in the flexible layer 10.

In the above step S20, the recesses may be formed in the flexible layer for example by imprinting process. The imprinting process may be implemented by available nanometer imprinting apparatus in the art. The imprinting process may be performed to form recesses 11 in the flexible layer 10 (notches in the flexible layer are formed in finished flexible substrate). Certainly, in accordance with embodiments of the present disclosure, in the above step S20, other than the imprinting process in the embodiments shown in figures, the flexible layer may alternatively be processed by any other suitable processes for forming recesses (such as lasering or plasma processes) as long as structures including notches 11 can be formed in the flexible layer. In addition, according to embodiments of the present disclosure, the notches 11 may have any suitable shapes of cross sections. The present disclosure is not limited to this.

The step S30: transferring the flexible layer 10 formed with the notches 11 from the base plate 30 to a stretchable base material 20.

The step S40: stretching the stretchable substrate 20 with the flexible layer 10 adhered thereon such that the notches 11 expand and deform until the flexible layer 10 cracks (for example cracks partly) along the notches 11 to provide deformation required for the flexible substrate.

As shown in FIG. 4 and FIG. 5, after the step S10 and before the step S20, the method provided by the embodiments of the present disclosure may further include the following steps.

The step S20A: performing a first drying process on the flexible layer 10 to form a flexible layer initially dried, wherein 10% to 80% of solvent in the flexible layer is removed in the first drying process.

The first drying process on the flexible layer is beneficial to formation of the recesses in the subsequent steps. It should be noted that the main function of "drying process" described herein is to remove solvent in the flexible layer. Substantially 10% to 80% of solvent in the flexible layer may be removed in the first drying process on the flexible layer. And the apparatus for performing the first drying process may be suitable drying apparatus in the art, for example, a vacuum dryer.

As shown in FIG. 4 and FIG. 5, after the step S20 and before the step S30, the method provided by the embodiments of the present disclosure may further include the following steps.

The step S20B: performing a second drying process on the flexible layer 10 which has the notches 11 and which has been dried initially, wherein more than 90% of the solvent in the flexible layer is removed in the second drying process.

By means of the above step S20B, the flexible layer 10 which has been dried twice is formed, so as to form the flexible layer with notches in the flexible substrate. In addition, the apparatus for performing the second drying process may be suitable drying apparatus in the art, for example, a vacuum dryer. After the step, the flexible layer with notches of the flexible substrate may be formed. Further, in the above step S20B, the second drying process may further include curing the flexible layer 10 which has been dried twice, for example, when the flexible layer uses precursor of PI (i.e., poly(amic-acid) (PAA)), PAA is converted into PI by curing. And finally the flexible layer 10 that is dried twice (and cured) may have thickness in range of 5 µm to 20 µm. In accordance with embodiments of the present disclosure, the thickness of the notches 11 may be less than or equal to thickness of the flexible layer 10. In this way, the flexible layer 10 dried twice may be the flexible layer in the flexible substrate as described in the above embodiments of the present disclosure, and the notches 11 may be the notches formed in the flexible layer of the flexible substrate as described in the above embodiments of the present disclosure.

In addition, in the method provided by the embodiments of the present disclosure, before forming the flexible layer 10 on the base plate 30, a releasing layer or a sacrifice layer may be produced on the base plate 30, for convenience of transferring of the flexible layer in subsequent steps.

According to some embodiments, as shown in FIG. 4 and FIG. 5, after the step S20 and before the step S30, the method provided by the embodiments of the present disclosure may further include the following step S21 and step S22.

The step S21: forming a filling layer 12' on the flexible layer 10 including the notches 11, wherein a first material forming the flexible layer 10 and a second material forming the filling layer 12' are configured such that there is a weak adhesion interface between the flexible layer and the filling layer.

In the step S21, the adhesion interface between the flexible layer 10 made from the first material and the fillers 12 made from the second material should have weak adhesion property with respect to each other. In this way, the fillers 12 may be separated easily from the notches 11 when the flexible substrate is stretched, for cracking of the flexible layer 10 at the notches 11. In an example, the first material may be an organic material such as PI and the second material may be an inorganic material. In another example, the first material and the second material are two inorganic materials that can form a weak adhesion interface between them, respectively. In a further example, the first material and the second material are two organic materials that can form the weak adhesion interface between them, respectively.

The step S22: etching and ashing the filling layer 12' to expose the flexible layer 10 while maintaining part of the filling layer 12' filled in the notches 11.

After performing the above step S22, a part of the filling layer 12' at least fills the notches 11 of the flexible layer 10 to form fillers 12.

After performing the above steps S21 and S22, the thickness for etching and ashing should be greater than or equal to the thickness of the filling layer 12' on the flexible layer 10 such that after the step has been performed, only the notches 11 in the flexible layer 10 are filled with fillers made from the filling material.

According to some embodiments, as shown in FIG. 4 and FIG. 5, after the step S22 and before the step S30, the method provided by the embodiments of the present disclosure may further include the following step.

The step S23: forming a buffer layer 50 on the exposed flexible layer 10.

After performing the above step S23, a planarization surface formed by the flexible layer 10 and the fillers 12 in the notches 11 in combination may be obtained.

After the step S23, elements used for display such as TFT (thin film transistor) may be produced on the exposed surface of the flexible layer 10 (or the surface of the buffer layer 50). The functional elements 15 (for example used for display) such as TFT (thin film transistor) are formed on the position on the surface of the flexible layer 10 where no notches are provided. And subsequently, the elements produced on the surface of the flexible layer 10 are evaporated and encapsulated.

In the method provided by embodiments of the present disclosure, by using the above steps S21 to S23, the flexible layer 10 and the fillers 12 filled in the notches 11 are made from different materials having weak adhesion interface between them, respectively. It not only provides flatness of the film layer, but also tends to tear the flexible layer 10 along the side wall of the notches 11 (i.e., the weak adhesion interface between the flexible layer 10 and the fillers 12) when the flexible layer 10 is stretched to have a special amount of strain, so as to cause deformation and crack at the notches 11. In this way, the flexible layer 10 that has been dried twice may be the flexible layer in the flexible substrate described by the above embodiments of the present disclosure. The notches 11 may be notches formed in the flexible layer in the flexible substrate described in the above embodiments of the present disclosure while the part of the filling layer charged in the notches 11 may be fillers 12 charged in the notches of the flexible layer in the flexible substrate described in the above embodiments of the present disclosure.

Thus, in the method for producing the flexible substrate provided by embodiments of the present disclosure, a plurality of notches are formed in the flexible layer of the flexible substrate. When the flexible substrate is stretched, these notches can be expanded and deformed until the flexible layer cracks at these notches to provide deformation required for the flexible substrate, so as to reduce or even prevent functional elements used for display on the flexible substrate from being affected by stretching strains, so as to improve display quality of the flexible display apparatus including the flexible substrate. And a plurality of groups of notches separated from each other are formed on the flexible layer and each group of notches include a plurality of notches separated from each other and arranged linearly in the flexible layer. When the flexible substrate is stretched, parts between adjacent notches in each group of notches in the flexible layer crack along the direction in which the group of notches are arranged such that each group of notches form a hole with larger aperture, to further provide the deformation required for the flexible substrate.

In addition, in the method for producing the flexible substrate provided by embodiments of the present disclosure, positions and spaces of the cracking faces when the flexible substrate is stretched can be controlled by designing the specific positions of the notches on the flexible layer in advance.

Further, in the method for producing the flexible substrate provided by embodiments of the present disclosure, by designing expandable notches in form of gaps with small aperture on the flexible layer, the resolution of wiring can be enhanced in comparison with, for example, hole and groove regions in the related art.

Although some embodiments of the present disclosure have been shown and explained, the skilled person in the art will appreciated that these embodiments can be modified without departing from principles and spirits of the present disclosure. Scope of the present disclosure will be defined by the appended claims and equivalents thereof.

What is claimed is:

1. A flexible substrate comprising:
   a flexible layer,
   wherein the flexible layer has a plurality of notches which have a first maximum width along a stretch direction in a stretched state of the flexible layer and have a second maximum width along the stretch direction in an unstretched state of the flexible layer,
   wherein the first maximum width is greater than the second maximum width, and
   wherein the flexible substrate further comprises: fillers in the notches, wherein there is a weak adhesion interface between the flexible layer and the fillers.

2. The flexible substrate of claim 1, wherein the flexible layer and the fillers are made from different materials, respectively.

3. The flexible substrate of claim 1, wherein the plurality of notches further comprises a plurality of groups of notches and each group of the plurality of groups of notches comprises a plurality of notches separated from each other and arranged linearly in the flexible layer.

4. The flexible substrate of claim 3, wherein in the stretched state of the flexible layer, each group of notches are communicated together to form a hole.

5. The flexible substrate of claim 4, wherein the hole has a rhombic shape in a cross section thereof parallel to the flexible layer.

6. The flexible substrate of claim 3, wherein the plurality of groups of notches comprise rows of notches and columns of notches that are arranged alternately in the flexible layer and separated from each other.

7. The flexible substrate of claim 1, wherein depths of the notches in the flexible layer are less than or equal to thickness of the flexible layer.

8. The flexible substrate of claim 1, further comprising:
   a stretchable base material on which flexible layer is provided.

9. The flexible substrate of claim 8, wherein orthogonal projections of the notches in the flexible layer on the stretchable base material are located on solid part of the stretchable base material.

10. The flexible substrate of claim 1, wherein the flexible layer comprises:
    a plurality of functional element regions in which functional elements are arranged; and
    non-functional element regions between adjacent functional element regions, the notches being arranged in the non-functional element regions.

11. A flexible display apparatus, comprising: the flexible substrate of claim 1.

12. A method for producing a flexible substrate, the method comprising:
    forming a flexible layer on a base plate;
    forming notches in the flexible layer; and
    transferring the flexible layer formed with the notches from the base plate to a stretchable base material to form the flexible substrate;
    wherein before forming the notches in the flexible layer, the method further comprises: performing a first drying process on the flexible layer;
    wherein after forming the notches in the flexible layer, the method further comprises: performing a second drying process on the flexible layer;
    wherein before performing the second drying process, the method further comprises:
        forming a filling layer on the flexible layer formed with the notches, wherein a first material forming the flexible layer and a second material forming the filling layer are configured such that there is a weak adhesion interface between the flexible layer and the filling layer;
        etching and ashing the filling layer to expose the flexible layer while maintaining part of the filling layer filled in the notches; and
        forming a buffer layer on the exposed flexible layer.

13. The method of claim 12, wherein the forming notches in the flexible layer comprises forming notches, having depths less than or equal to thickness of the flexible layer, in the flexible layer.

14. The method of claim 12, wherein the second drying process further comprises curing the flexible layer.

15. The method of claim 12, further comprising:
    stretching the stretchable substrate with the flexible layer adhered thereon such that the notches expand and deform until the flexible layer cracks along the notches.

16. The method of claim 12, wherein 10% to 80% of a solvent in the flexible layer is removed in the first drying process; and
    wherein more than 90% of the solvent in the flexible layer is removed in the second drying process.

* * * * *